United States Patent
O'Connell (10) Patent No.: US 11,100,980 B2
(45) Date of Patent: Aug. 24, 2021

(54) ORTHOGONAL DUAL PORT RAM (ORAM)

(71) Applicant: Taiwan Semiconductor Manufacturing Company, Ltd., Hsinchu (TW)

(72) Inventor: Cormac Michael O'Connell, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 16/584,257

(22) Filed: Sep. 26, 2019

(65) Prior Publication Data
US 2020/0135267 A1 Apr. 30, 2020

Related U.S. Application Data

(60) Provisional application No. 62/753,170, filed on Oct. 31, 2018.

(51) Int. Cl.
*G11C 11/419* (2006.01)
*G11C 11/418* (2006.01)
*G11C 11/4097* (2006.01)
*G11C 11/4096* (2006.01)

(52) U.S. Cl.
CPC ........ *G11C 11/419* (2013.01); *G11C 11/4096* (2013.01); *G11C 11/4097* (2013.01); *G11C 11/418* (2013.01)

(58) Field of Classification Search
CPC .................................................... G11C 8/16
See application file for complete search history.

(56) References Cited

U.S. PATENT DOCUMENTS 4,435,787 A * 3/1984 Yasuoka ............... G11C 11/419
365/174
4,823,314 A 4/1989 Sharp
(Continued)

FOREIGN PATENT DOCUMENTS

CN 104425007 A 3/2015
EP 0 952 614 A1 10/1999
JP 2009-16646 A 1/2009

OTHER PUBLICATIONS

Hock, "Modern Semiconductor Technologies for Neuromorphic Hardware," Ph.D. Thesis, Ruperto-Carola University of Heidelberg, Germany, 221 pages. (Jul. 2, 2014).

*Primary Examiner* — Douglas King
(74) *Attorney, Agent, or Firm* — Merchant & Gould P.C.

(57) ABSTRACT

An Orthogonal Dual Port Ram (ORAM) memory cell may be provided. The ORAM memory cell may comprise a data storage element, a first port bit line, and a second port bit line that may be substantially perpendicular to first port bit line. The ORAM memory cell may further comprise a first word line that may be substantially perpendicular to first port bit line wherein the ORAM memory cell may be configured to read data from the data storage element to the first port bit line when the first word line is enabled. The ORAM memory cell may further comprise a second word line being substantially perpendicular to the second port bit line wherein the ORAM memory cell may be configured to read data from the data storage element to the second port bit line when the second word line is enabled.

20 Claims, 6 Drawing Sheets

(56) References Cited

U.S. PATENT DOCUMENTS

| | | | |
|---|---|---|---|
| 8,077,492 B2 * | 12/2011 | Dosaka | G11C 15/04 365/49.1 |
| 9,646,974 B1 | 5/2017 | Liaw | |
| 2002/0093508 A1 | 7/2002 | Sandford | |
| 2006/0143428 A1 * | 6/2006 | Noda | G06F 7/785 712/10 |

* cited by examiner

ORTHOGONAL DUAL PORT RAM (ORAM)

CROSS-REFERENCE TO RELATED APPLICATIONS

This application claims priority to U.S. Provisional Application No. 62/753,170, filed on Oct. 31, 2018, and entitled "ORTHOGONAL DUAL PORT RAM (ORAM)", of which the entire disclosure is hereby incorporated by reference in its entirety.

BACKGROUND

Semiconductor memory is an electronic data storage device implemented on a semiconductor-based integrated circuit. Semiconductor memory has many different types, and has faster access times than other data storage technologies. For example, a byte of data can often be written to or read from semiconductor memory within a few nanoseconds, while access times for rotating storage, such as hard disks, is in the range of milliseconds. For these reasons, among others, semiconductor memory is used as a primary storage mechanism for computers to hold data computers are currently working on, among other uses.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Static Random Access Memory (SRAM) is a type of semiconductor memory that stores data in the form of bits using bistable circuitry without the need for refreshing. An SRAM cell may be referred to as a bit cell because it may store a bit of information. Memory arrays include multiple bit cells arranged in rows and columns. Each bit cell in a memory array may include connections to a power supply voltage and to a reference voltage. Bit Lines (BL) may be used for accessing a bit cell, with a Word Line (WL) controlling connections to the bit lines. A WL may be coupled to the bit cells in a row of a memory array, with different WLs provided for different rows.

Dual-ported RAM (DPRAM) may comprise a type of random-access memory that may allow multiple reads or writes to occur at the same time, or nearly the same time, unlike single-ported RAM that may allow one access at a time. Most CPUs may implement the processor registers as a small dual-ported or multi-ported RAM.

While an SRAM memory cell is described below, embodiments of the disclosure may be implemented using any type dual-ported BitCells comprising, for example, Dynamic Random-access Memory (DRAM), Magnetoresistive Random-access Memory (MRAM), Resistive Random-access Memory (RRAM), etc. With a DRAM, there may be two access devices each for port A and B respectively to connect to the storage node. Handling concurrent multiple accesses may have to be handled carefully as the DRAM-Read cycle may be destructive and may require data write back. While embodiments of the disclosure may use dual port BitCells (i.e., two complete read/write ports), two port BitCell (e.g., port A is a write-only channel and port-B is a read-only channel) may also be used. The latter may be functional limited to unidirectional data-flow, but may have a smaller, low-power, simpler periphery.

Conventional memory arrays may be set up to where memory cells in a column of the array may be connected by a BL or BLs and all BLs may run in parallel. Hence a bit, a word, or a row may be accessed, in one access cycle, but to access bits alone in a column, multiple row-access may be run and the data of interest may be accumulated from each cycle, discarding all the other bits. Accordingly, conventional processes may be time and power consuming when column access is desired.

Embodiments of the disclosure may allow both single cycle row access and single cycle column access of a memory array. For example, embodiments of the disclosure may be used to accelerate matrix multiplications where elements in a row of one matrix may be accessed and then multiplied by elements in a column of another array, writing the result into a resultant matrix's row or column.

An array of dual-ported SRAM bit cells may be provided by embodiments of the disclosure in which a bit cell may be modified to have the WL and BLs of one port provided orthogonal to the second port's WL and BLs. This may enable one port to read from or write to the array's rows in a single cycle while the second port may read from or write to the array's columns also in a single cycle. Accordingly, embodiments of the disclosure may be used, for example, in a compute engine in which matrix manipulation/calculation (e.g., multiply accumulate) may be frequent and/or important to the speed plus power of operation (e.g., Neural Networks, Transaction Engines, Graphics, Filtering, etc.). Accordingly, embodiments of the disclosure may provide, for example, an orthogonal fully dual-ported eight transistor (8T) memory cell (i.e., bit cell) based array architecture to a matrix manipulation that may require many row and column accesses (e.g. Neural Network Processors, Transaction Engines, etc.).

Disclosed examples thus may provide single cycle array-column and array-row random accesses, allowing both ports to read and write, and reduce array access power. Embodiments of the disclosure may provide, for example, an 8T bit cell port A orthogonal to a port B bit cell architecture including an orthogonal dual-ported memory architecture. Embodiments of the disclosure may enable system "row" and "column" handling and may reduce system power for "row" and "column" handling.

Figure 1:
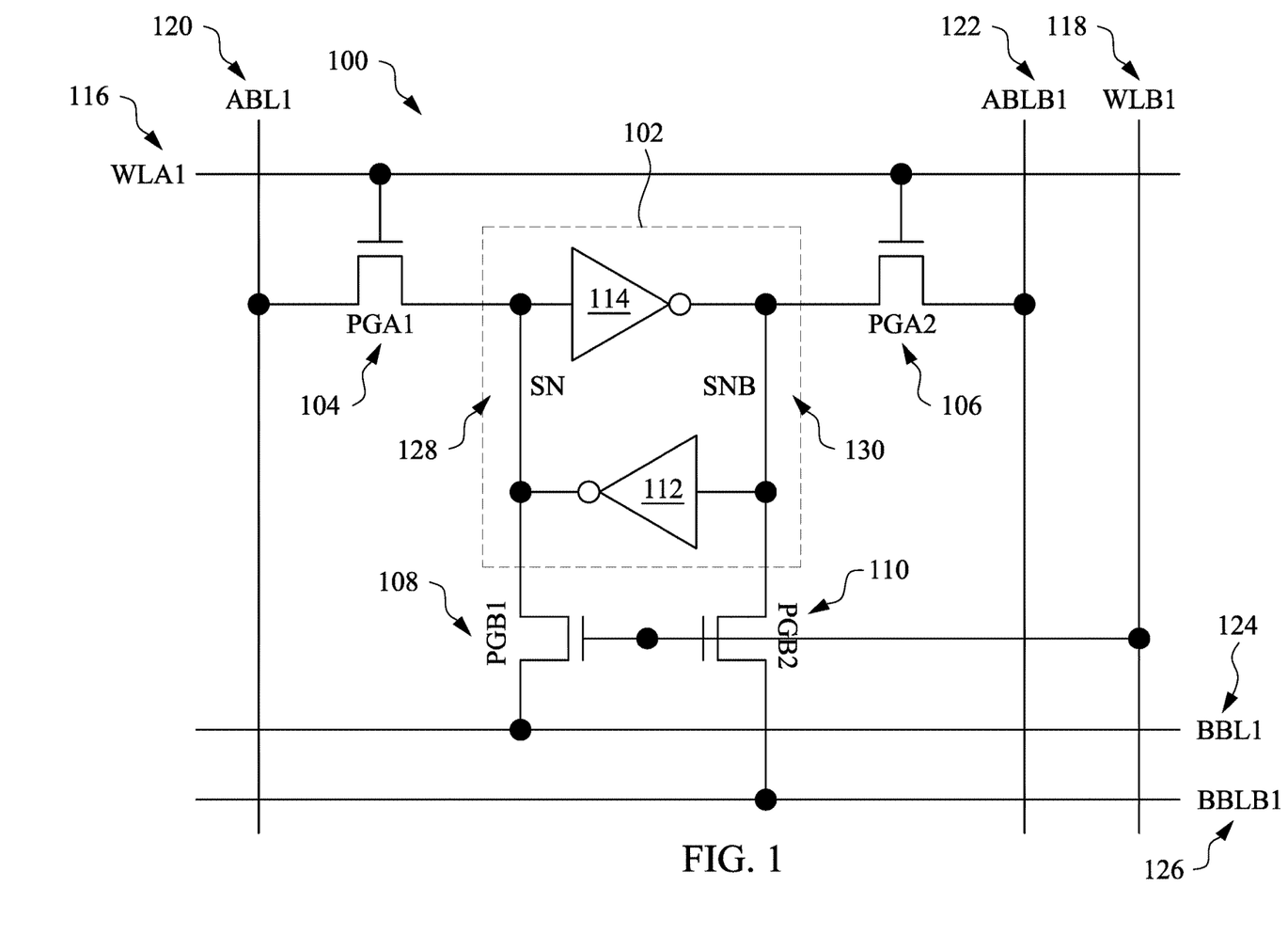
FIG. 1 is a diagram that illustrates a memory cell in accordance with some embodiments.

FIG. 1 illustrates an Orthogonal Dual Port Ram (ORAM) memory cell 100 consistent with embodiments of the disclosure. ORAM memory cell 100 may comprise a "dual port" SRAM memory cell having a port A and a port B for example. As shown in FIG. 1, ORAM memory cell 100 may comprise a data storage element 102, a first port A pass gate 104 (i.e., PGA1), a second port A pass gate 106 (i.e., PGA2), a first port B pass gate 108 (i.e., PGB1), and a second port B pass gate 110 (i.e., PGB2). Data storage element 102 may comprise a first inverter 112 and a second inverter 114. ORAM memory cell 100 may further comprise a port A word line 116 (i.e., WLA1), a port B word line 118 (i.e., WLB1), a first port A bit line 120 (i.e., ABL1), a second port A bit line 122 (i.e., ABLB1), a first port B bit line 124 (i.e., BBL1), and a second port B bit line 126 (i.e., BBLB1). ORAM memory cell 100 may further comprise a Storage Node (SN) 128 and a Storage Node Bar (SNB) 130.

As shown in FIG. 1, first port A bit line 120 and second port A bit line 122 may be substantially parallel. Similarly, first port B bit line 124 and a second port B bit line 126 may be substantially parallel. Consistent with embodiments of the disclosure, first port A bit line 120 and second port A bit line 122 may be substantially perpendicular to first port B bit line 124 and a second port B bit line 126. In addition, port A word line 116 may be substantially perpendicular to port B word line 118.

First inverter 112 and second inverter 114 may be cross-coupled to one another to establish SN 128 and SNB 130 (i.e., SN "bar"). SN 128 and SNB 130 may be complementary. For example, one data storage node may be biased to carry a first voltage corresponding to a logical "1", while the other data storage node may be biased to carry a second voltage corresponding to a logical "0". Thus, first inverter 112 and second inverter 114 may store a bit of data in a mutually reinforcing fashion.

First port A pass gate 104, second port A pass gate 106, first port B pass gate 108, and second port B pass gate 110 may each comprise a transistor and may selectively couple SN 128 and SNB 130 respectively to first port A bit line 120, second port A bit line 122, first port B bit line 124, and second port B bit line 126 based on whether port A word line 116 and port B word line 118 are enabled. This may allow data to be selectively read from or written to data storage element 102. First inverter 112 and second inverter 114 may each comprise two transistors, thus ORAM memory cell 100 may be considered to be an eight transistor (i.e., "8T") memory cell or bit cell.

With regards to port A, first port A pass gate 104 may be electrically coupled to SN 128 and second port A pass gate 106 may be electrically coupled to SNB 130. First port A pass gate 104 selectively couples SN 128 to first port A bit line 120 based on a voltage of port A word line 116, whereas second port A pass gate 106 selectively couples SNB 130 to second port A bit line 122 based on the voltage of port A word line 116. First port A bit line 120 and second port A bit line 122 may be complementary and thus may form a complementary bit line pair.

With regard to port B, first port B pass gate 108 may be electrically coupled to SN 128 and second port B pass gate 110 may be electrically coupled to SNB 130. First port B pass gate 108 selectively couples SN 128 to first port B bit line 124 based on a voltage of port B word line 118, whereas second port B pass gate 110 selectively couples SNB 130 to second port B bit line 126 based on the voltage of port B word line 118. First port B bit line 124 and second port B bit line 126 may be complementary and thus may form a complementary bit line pair.

While FIG. 1 illustrates a dual port SRAM memory cell, embodiments of the disclosure may also include a 2-Port SRAM memory cell and are not limited to a dual port SRAM. In other words, while FIG. 1 describes a dual port (e.g., two complete read/write ports), other embodiments include a 2-Port version, for example, where port A is a write-only channel and Port-B is a read-only channel.

Figure 2:
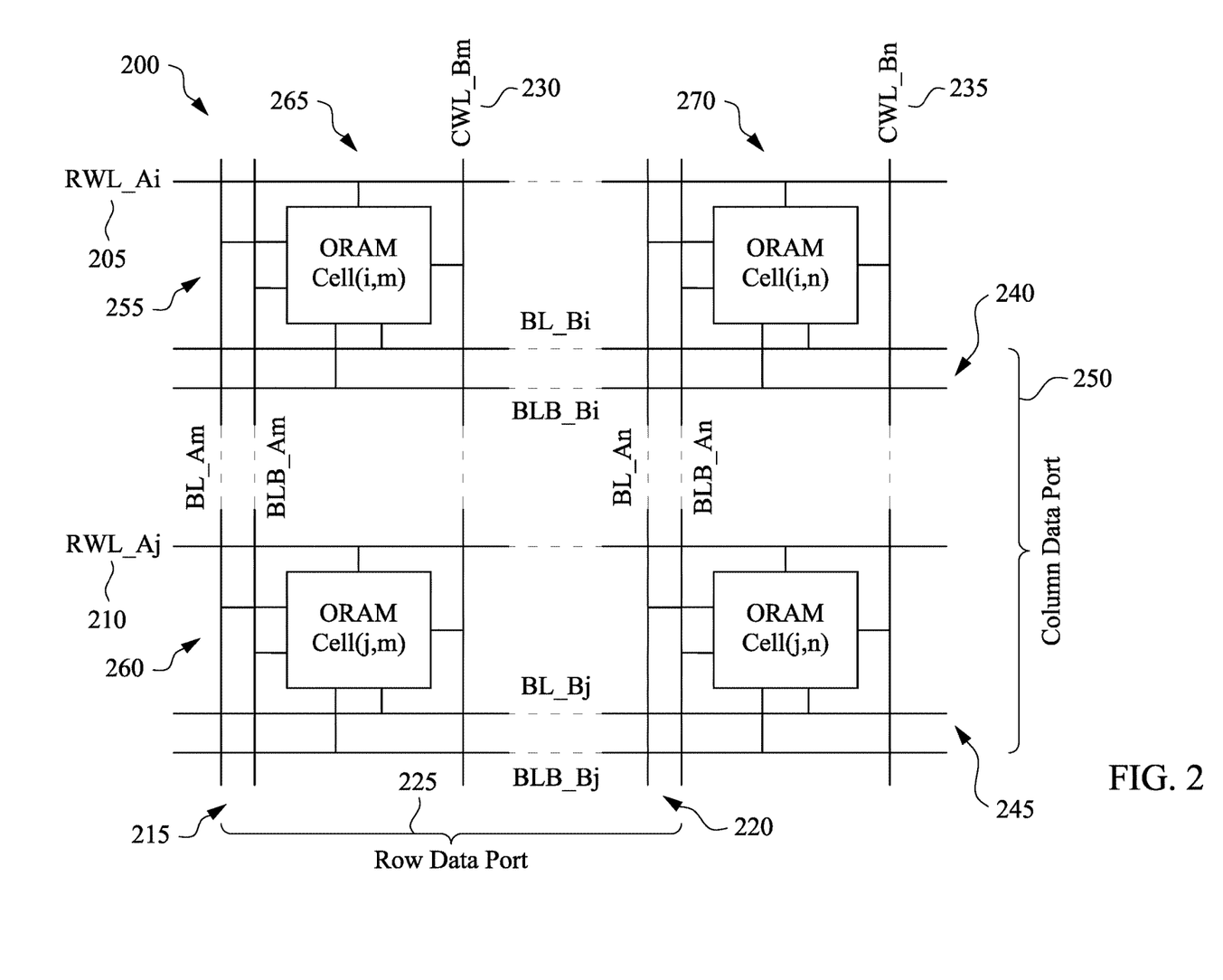
FIG. 2 is a diagram that illustrates an Orthogonal Dual Port Ram (ORAM) memory array in accordance with some embodiments.

FIG. 2 illustrates an Orthogonal Dual Port Ram (ORAM) memory array 200 consistent with embodiments of the disclosure. As shown in FIG. 2, ORAM memory array 200 may comprise a plurality of ORAM memory cells arranged in rows and columns. Each of the plurality of ORAM memory cells may comprise ORAM memory cell 100 as described above with respect to FIG. 1. Notwithstanding, the plurality of ORAM memory cells in ORAM memory array 200 may comprise any type dual port BitCell and are not limited to dual port SRAM. The rows in ORAM memory array 200 may range between "i" and "j" and the columns may range between "m" and "n". The number of rows in ORAM memory array 200 may comprise any number of rows and the number of columns in ORAM memory array 200 may comprise any number of columns.

As shown in FIG. 2, each row in ORAM memory array 200 may have a plurality of row word lines. For example, row i may have a row i word line 205 and row j may have a row j word line 210. In this example, these row word lines may correspond to port A of ORAM memory cell 100. In addition, each row in ORAM memory array 200 may have a plurality of column bit lines. For example, first column bit lines 215 may correspond to the column m memory cells of a given row and second column bit lines 220 may correspond to the column n memory cells of a given row. The bit lines comprising first column bit lines 215 may comprise a complementary bit line pair as described above. Similarly, the bit lines comprising second column bit lines 220 may comprise a complementary bit line pair as described above. In this example, first column bit lines 215 and second column bit lines 220 may correspond to port A on ORAM memory cell 100 and may terminate in a row data port 225. When a word line corresponding to a row (e.g., row i word line 205 or row j word line 210) is enabled, memory cells in the corresponding row in ORAM memory array 200 may be enabled and selectively read from or written to row data port 225.

Furthermore, as shown in FIG. 2, each column in ORAM memory array 200 may have a plurality of column word lines. For example, column m may have a column m word line 230 and column n may have a column n word line 235. In this example, these column word lines may correspond to port B of ORAM memory cell 100. In addition, each column in ORAM memory array 200 may have a plurality of row bit lines. For example, first row bit lines 240 may correspond to the row i memory cells of a given column and second row bit lines 245 may correspond to the row j memory cells of a given column. The bit lines comprising first row bit lines 240 may comprise a complementary bit line pair as described above. Similarly, the bit lines comprising second row bit lines 245 may comprise a complementary bit line pair as described above. In this example, first row bit lines 240 and second row bit lines 245 may correspond to port B of ORAM memory cell 100 and may terminate in a column data port 250. When a word line corresponding to a column (e.g., column m word line 230 or column n word line 235) is enabled, memory cells in the corresponding column in ORAM memory array 200 may be activated and selectively read from or written to column data port 250.

As shown in FIG. 2, a first portion of the plurality of ORAM memory cells in ORAM memory array 200 may be arranged in a first row 255. A second portion of the plurality of ORAM memory cells in ORAM memory array 200 may be arranged in a second row 260. A third portion of the plurality of ORAM memory cells in ORAM memory array 200 may be arranged in a first column 265. A fourth portion of the plurality of ORAM memory cells in ORAM memory array 200 may be arranged in a second column 270.

Consistent with embodiments of the disclosure, first column bit lines 215 and second column bit lines 220 may be substantially parallel. Similarly, first row bit lines 240 and second row bit lines 245 may be substantially parallel. However, first column bit lines 215 and second column bit lines 220 may be substantially perpendicular (i.e., orthogonal) to first row bit lines 240 and second row bit lines 245. Row i word line 205 and row j word line 210 may be substantially parallel. Similarly, column m word line 230 and column n word line 235 may be substantially parallel. However, row i word line 205 and row j word line 210 may be substantially perpendicular (i.e., orthogonal) to column m word line 230 and column n word line 235.

Figure 3:
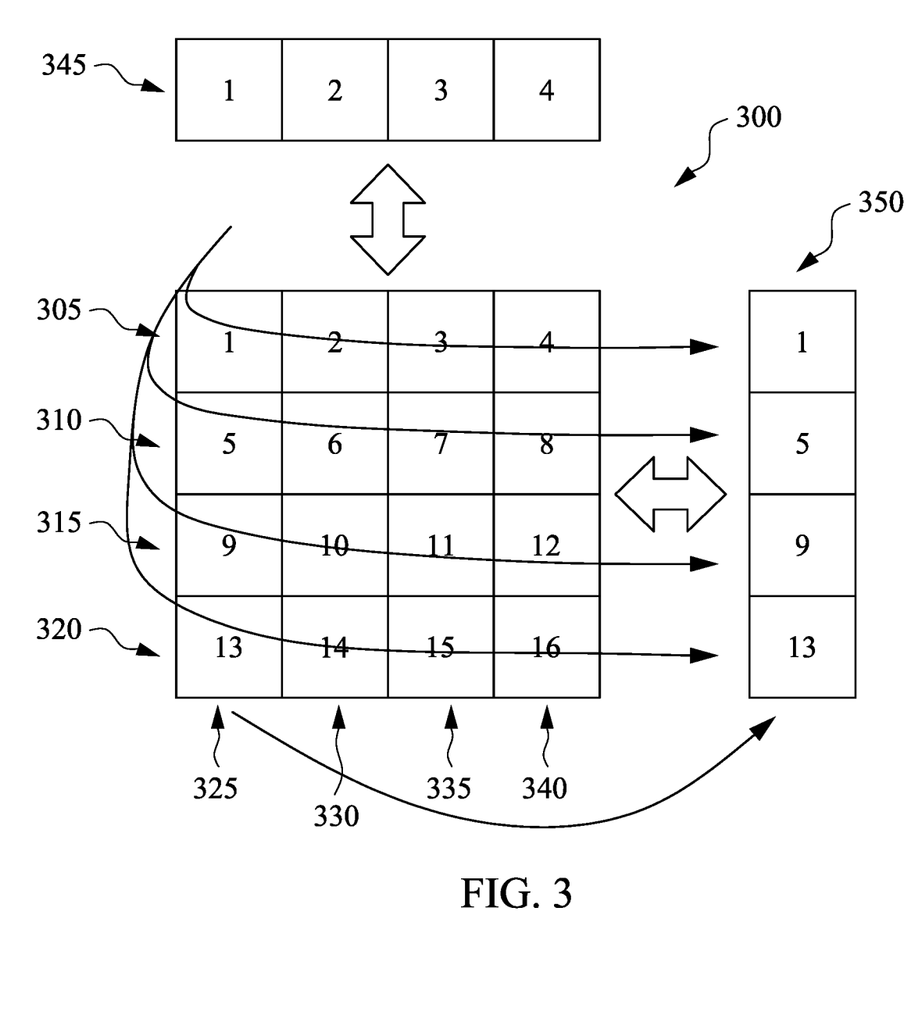
FIG. 3 illustrates allowing both single cycle row access and single cycle column access of a memory array in accordance with some embodiments.

As illustrated by FIG. 3, embodiments of the disclosure may allow both single cycle row access and single cycle column access of a memory array 300. Memory array 300 may comprise ORAM memory array 200 of FIG. 2. As shown in FIG. 3, memory array 300 may comprise a plurality of memory cells arranged in rows and columns. For example, memory array 300 may have four rows comprising a first row 305, a second row 310, a third row 315, and a fourth row 320. Similarly, memory array 300 may have four columns comprising a first column 325, a second columns 330, a third column 335, and a fourth column 340. When a word line corresponding to first row 305 is activated in a single cycle, memory cells in memory array 300 comprising first row 310 may be read from or written to row data port 345. When a word line corresponding to first column 325 is activated in a single cycle, memory cells in memory array 300 comprising first column 325 may be read from or written to column data port 350. This process may be applied to any row or any column in memory array 300.

Figure 4:
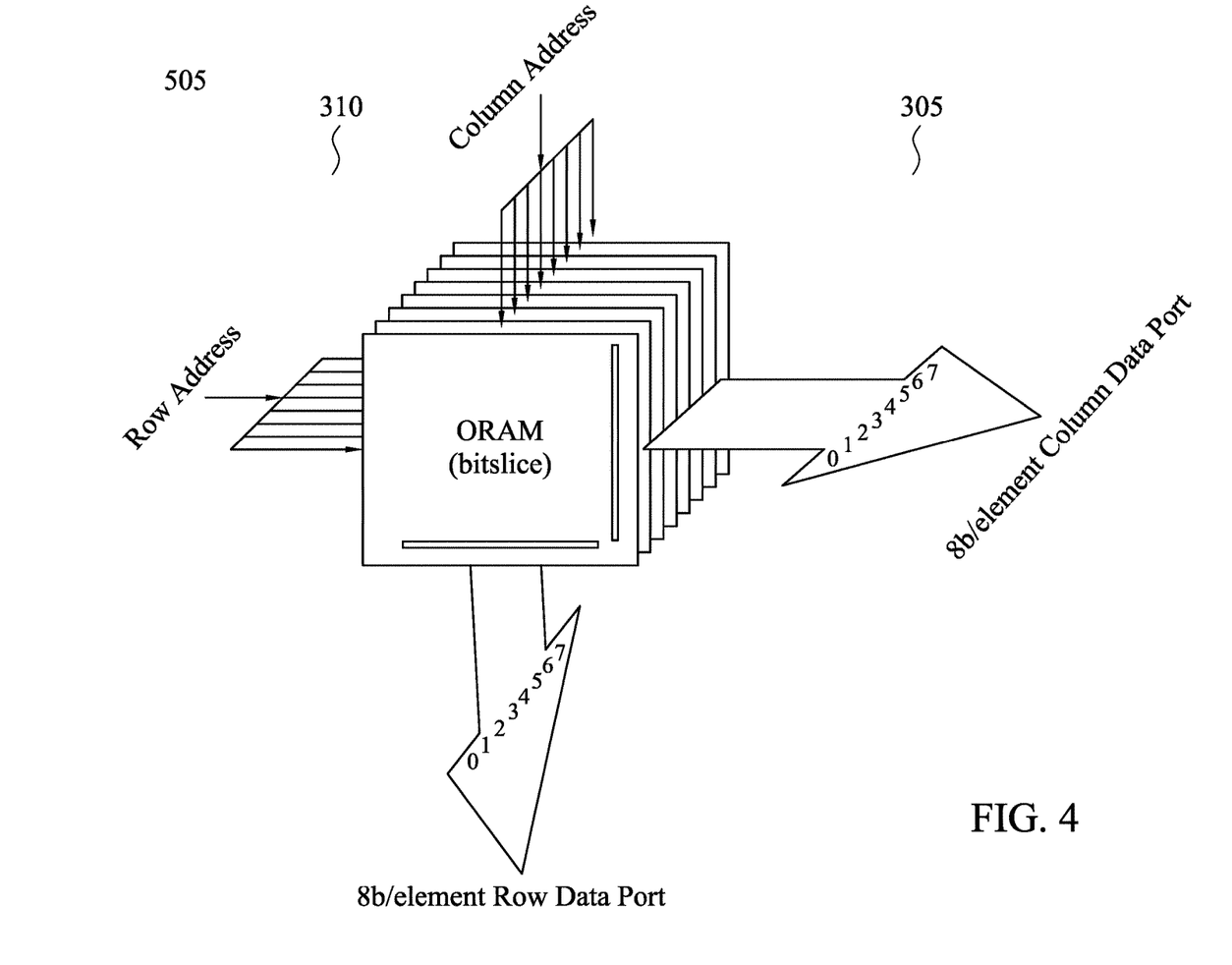
FIG. 4 illustrates an aspect of the disclosure using an eight bit word ORAM implementation example in accordance with some embodiments.

FIG. 4 further illustrates the aspect of the disclosure from FIG. 3 where memory cells may be read from or written to a row data port or a column data port using an 8-Bit word ORAM implementation example. As shown in FIG. 4, an ORAM memory cell 400 may comprise eight memory arrays in parallel. Each of the parallel memory cells of ORAM memory cell 400 may each comprise, for example, memory array 300 shown in FIG. 3. ORAM memory cell 400 may comprise any number of parallel memory arrays and is not limited to eight. When any of a plurality of row addresses 405 (e.g., word lines) is activated in a single cycle, memory cells in ORAM memory cell 400 may be read from or written to a row data port 410. Similarly, when any of a plurality of column addresses 415 (e.g., word lines) is activated in a single cycle, memory cells in ORAM memory cell 400 may be read from or written to a column data port 420. Accordingly, each one of the plurality of parallel arrays in ORAM memory cell 400 may provide one bit of an 8-bit word to either row data port 410 or column data port 420. Consequently, the elements in a row of one array may be accessed and multiplied (or any other type operation) by elements of a column in another array, and the results may be written to a row or column of another array for example.

Figure 5:
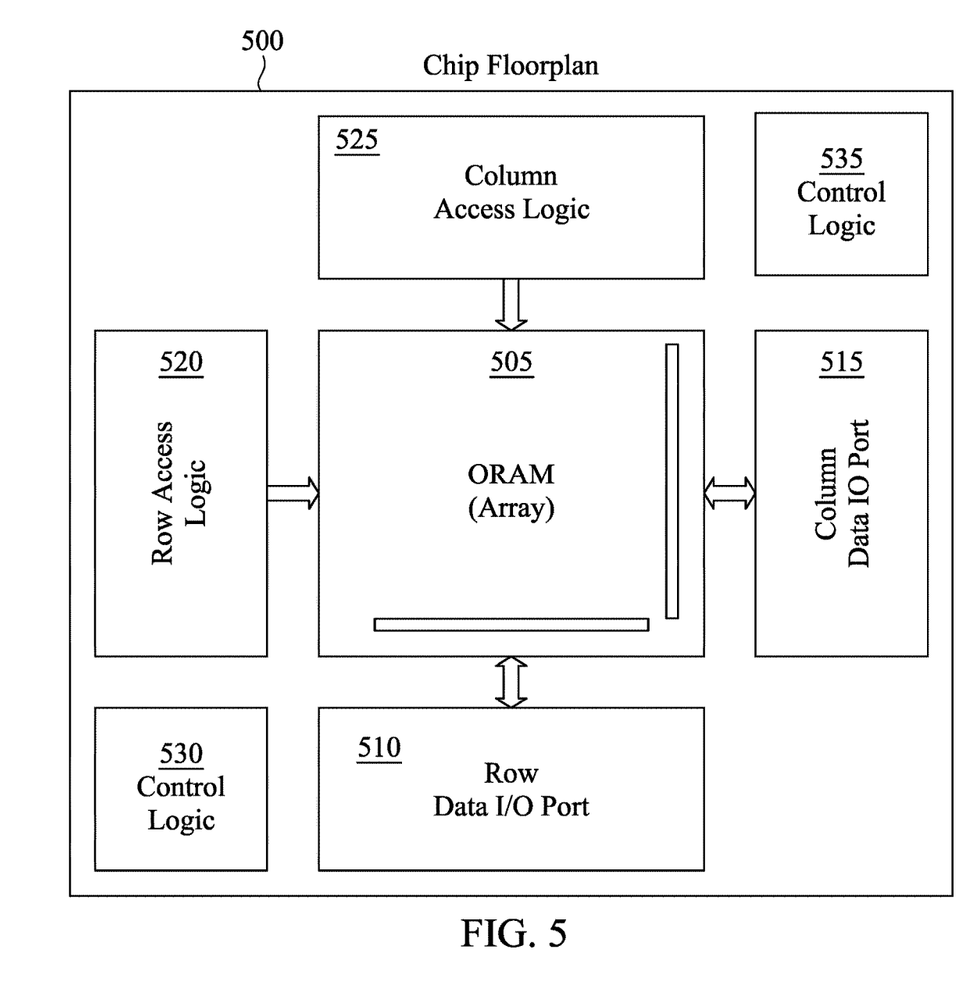
FIG. 5 illustrates a chip floorplan in accordance with some embodiments.

FIG. 5 illustrates a chip floorplan 500 for embodiments of the disclosure. Chip floorplan 500 may be used to implement ORAM memory cell 400 as a System on a Chip (SOC) for example. As shown in FIG. 5, chip floorplan 500 may comprise an ORAM array area 505 where ORAM array 200 (e.g., ORAM memory cell 400) may be located. Chip floorplan 500 may further comprise a row data I/O port area 510 where row data port 225 may be placed and a column data I/O port area 515 where column data port 250 may be placed. In addition, chip floorplan 500 may include a row access logic area 520 for row access logic and a column access logic area 525 for column access logic. Areas for additional control logic may be provided in a first control logic area 530 and a second control logic area 535.

Row access logic area 520 may comprise access logic that may receive signals to activate any of plurality of row addresses 405 (e.g., word lines) so that memory cells in ORAM memory cell 400 located in ORAM array area 505 may be read from or written to row data port 410 located in row data I/O port area 510. Similarly, column access logic area 525 may comprise access logic that may receive signals to activate any of plurality of column addresses 415 (e.g., word lines) so that memory cells in ORAM memory cell 400 located in ORAM array area 505 may be read from or written to column data port 420 located in column data I/O port area 515. Accordingly, ORAM memory cell 400 may be implemented as an SOC.

Figure 6:
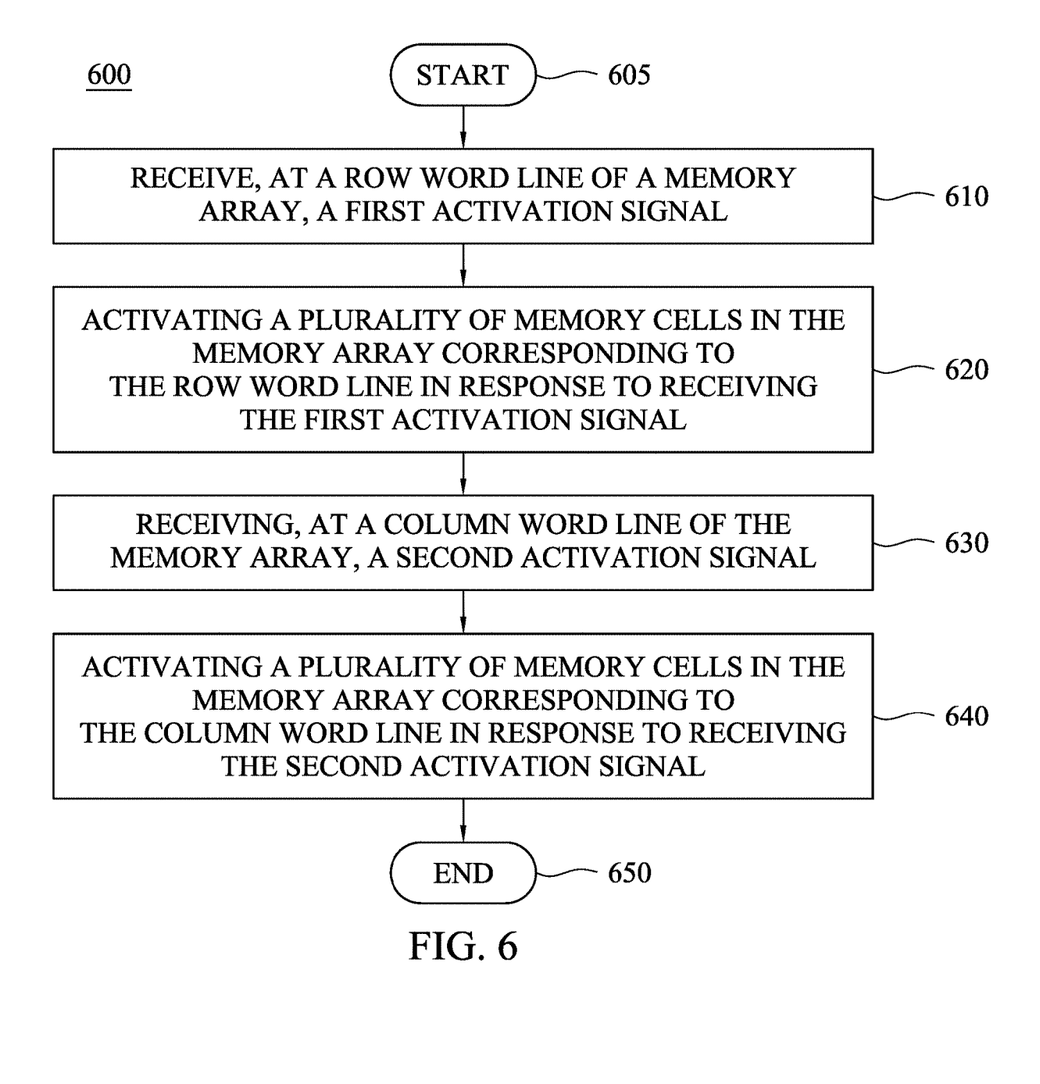
FIG. 6 illustrates a method for providing an ORAM memory array in accordance with some embodiments.

FIG. 6 is a flow chart setting forth the general stages involved in a method 600 consistent with an embodiment of the disclosure for providing an Orthogonal Dual Port Ram (ORAM) memory array. Method 600 may be implemented using ORAM memory array 200 as described in more detail above with respect to FIG. 2. Ways to implement the stages of method 600 will be described in greater detail below.

Method 600 may begin at starting block 605 and proceed to stage 610 where a row word line (e.g., row i word line 205 or row j word line 210) of memory array 200 may receive a first activation signal. For example, the first activation signal may comprise a single write cycle.

From stage 610, where the row word line (e.g., row i word line 205 or row j word line 210) of memory array 200 received the first activation signal, method 600 may advance to stage 620 where a plurality of memory cells in memory array 200 corresponding to the row word line may be activated in response to receiving the first activation signal. For example, data from row data port 225 may be written to the plurality of memory cells in the memory array 200 corresponding to the row word line (e.g., row i word line 205 or a row j word line 210) in response to receiving the first activation signal. Or data from the plurality of memory cells in the memory array 200 corresponding to the row word line (e.g., row i word line 205 or a row j word line 210) may be read to row data port 225 in response to receiving the first activation signal.

Once the plurality of memory cells in memory array 200 corresponding to the row word line are activated in stage 620, method 600 may continue to stage 630 where a second activation signal may be received at a column word line (e.g., column m word line 230 or column n word line 235) of the memory array 200. For example, the second activation signal comprises a single write cycle.

After the second activation signal is received at the column word line in stage 630, method 600 may proceed to stage 640 where a plurality of memory cells in memory array 200 corresponding to the column word line may be activated in response to receiving the second activation signal. For example, data from column data port 250 may be written to the plurality of memory cells in the memory array 200 corresponding to the column word line (e.g., column m word line 230 or column n word line 235) in response to receiving the second activation signal. Or data from the plurality of memory cells in the memory array 200 corresponding to the column word line (e.g., column m word line 230 or column n word line 235) may be read to column data port 250 in response to receiving the second activation signal. Once the plurality of memory cells in memory array 200 corresponding to the column word line are activated in stage 640, method 600 may then end at stage 650.

Embodiments of the disclosure may provide both single cycle row access and single cycle column access of a memory array. However, the ports are not limited to interleaved single cycles. For example, in some embodiments there may be many cycles on one port while the other port is quiet or active. A memory array of dual-ported SRAM bit cells may be provided by embodiments of the disclosure in which each of the dual-ported SRAM bit cells may be modified to have the WL and BLs of a first port arranged orthogonal (i.e., perpendicular) to a second port's WL and BLs. This may allow the first port to read from or write to the memory array's rows in a single cycle and may allow the second port to read from or write to the memory array's columns also in a single cycle.

An embodiment of the disclosure may comprise a memory array comprising a plurality of dual-ported memory cells. The memory array may comprise a first portion of the plurality of dual-ported memory cells being arranged in a first row, a second portion of the plurality of dual-ported memory cells being arranged in a second row, a third portion of the plurality of dual-ported memory cells being arranged in a first column, and a fourth portion of the plurality of dual-ported memory cells being arranged in a second column. The memory array may further comprise a first plurality of bit lines corresponding to the third portion of the plurality of dual-ported memory cells arranged in the first column and terminating at a row data port, a second plurality of bit lines corresponding to the fourth portion of the plurality of dual-ported memory cells arranged in the second column and terminating at the row data port, a third plurality of bit lines corresponding to the first portion of the plurality of dual-ported memory cells arranged in the first row and terminating at a column data port, and a fourth plurality of bit lines corresponding to the second portion of the plurality of dual-ported memory cells arranged in the second row and terminating at the column data port. The memory array may further comprise a first word line corresponding to the first portion of the plurality of dual-ported memory cells being arranged in the first row, a second word line corresponding to the second portion of the plurality of dual-ported memory cells being arranged in the second row, a third word line corresponding to the third portion of the plurality of dual-ported memory cells being arranged in the first column, and a fourth word line corresponding to the fourth portion of the plurality of dual-ported memory cells being arranged in the second column.

Another embodiment of the disclosure may comprise an apparatus. The apparatus may comprise a data storage element, a first port bit line, and a second port bit line being substantially perpendicular to first port bit line. The apparatus may further comprise a first word line being substantially perpendicular to first port bit line wherein the apparatus is configured to read data from the data storage element to the first port bit line when the first word line is enabled and a second word line being substantially perpendicular to the second port bit line wherein the apparatus is configured to read data from the data storage element to the second port bit line when the second word line is enabled.

An embodiment of the disclosure may comprise a method for providing a memory array comprising a plurality of dual-ported memory cells. The method may comprise receiving, at a row word line of a memory array, a first activation signal and activating a plurality of memory cells in the memory array corresponding to the row word line in response to receiving the first activation signal. The method may further comprise receiving, at a column word line of the memory array, a second activation signal and activating a plurality of memory cells in the memory array corresponding to the column word line in response to receiving the second activation signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
    a first memory array comprising a first plurality of dual-ported memory cells in a first plurality of rows and a first plurality of columns, wherein:
       a first portion of the first plurality of dual-ported memory cells are arranged in a first row;
       a second portion of the first plurality of dual-ported memory cells are arranged in a second row;
       a third portion of the first plurality of dual-ported memory cells are arranged in a first column;
       a fourth portion of the first plurality of dual-ported memory cells are arranged in a second column;
       a first plurality of bit lines corresponding to the third portion of the first plurality of dual-ported memory cells are arranged in the first column;
       a second plurality of bit lines corresponding to the fourth portion of the first plurality of dual-ported memory cells are arranged in the second column;

a third plurality of bit lines corresponding to the first portion of the first plurality of dual-ported memory cells are arranged in the first row;
a fourth plurality of bit lines corresponding to the second portion of the plurality of dual-ported memory cells are arranged in the second row;
a first word line corresponding to the first portion of the first plurality of dual-ported memory cells is arranged in the first row;
a second word line corresponding to the second portion of the first plurality of dual-ported memory cells is arranged in the second row;
a third word line corresponding to the third portion of the first plurality of dual-ported memory cells is arranged in the first column; and
a fourth word line corresponding to the fourth portion of the first plurality of dual-ported memory cells is arranged in the second column;
a second memory array comprising a second plurality of dual-ported memory cells in a second plurality of rows and a second plurality of columns, wherein the second plurality of dual-ported memory cells of the second memory array are arranged substantially parallel to the first plurality of dual-ported memory cells of the first memory array;
a third memory array comprising a third plurality of dual-ported memory cells in a third plurality of rows and a third plurality of columns, wherein the third plurality of dual-ported memory cells of the third memory array are arranged substantially parallel to the first plurality of dual-ported memory cells of the first memory array and the second plurality of dual-ported memory cells of the second memory array; and
a controller operative to:
read a first plurality of bits from a plurality of first dual-ported memory cells of a first row of the first plurality of rows of the first memory array in a first single cycle,
read a second plurality of bits from a plurality of second dual-ported memory cells of a first column of the second plurality of columns of the second memory array in a single second cycle, and
write a third plurality of bits into a plurality of third dual-ported memory cells of a third row of the third plurality of rows of the third memory array in a third single cycle.

2. The apparatus of claim 1, wherein the first plurality of bit lines and the second plurality of bit lines are substantially perpendicular to the third plurality of bit lines and the fourth plurality of bit lines.

3. The apparatus of claim 1, wherein the first word line and the second word line are substantially perpendicular to the third word line and the fourth word line.

4. The apparatus of claim 1, wherein the first memory array is configured to read from or written to the row data port data corresponding to the first portion of the first plurality of dual-ported memory cells arranged in the first row when the first word line is activated.

5. The apparatus of claim 1, wherein the first memory array is configured to read from or written to the row data port data corresponding to the second portion of the first plurality of dual-ported memory cells arranged in the second row when the second word line is activated.

6. The apparatus of claim 1, wherein the first memory array is configured to read from or written to the column data port data corresponding to the third portion of the first plurality of dual-ported memory cells arranged in the first column when the third word line is activated.

7. The apparatus of claim 1, wherein the first memory array is configured to read from or written to the column data port data corresponding to the fourth portion of the first plurality of dual-ported memory cells arranged in the second column when the fourth word line is activated.

8. The apparatus of claim 1, wherein the first plurality of dual-ported memory cells comprise Static Random Access Memory (SRAM) bit cells.

9. An apparatus, comprising:
a first memory array comprising a first plurality of dual-ported memory cells arranged in a first plurality of rows and a first plurality of columns, wherein each of the first plurality of data dual-ported memory cells comprises a data storage element connected to a first port bit line and a second port bit line, the second port bit line being substantially perpendicular to the first port bit line, wherein the data storage element is further connected to a first word line, the first word line being substantially perpendicular to the first port bit line,
wherein the data storage element is further connected to a second word line, the second word line being substantially perpendicular to the second port bit line wherein the apparatus is configured to read data from the data storage element to the second port bit line when the second word line is enabled
a second memory array comprising a second plurality of dual-ported memory cells arranged in a second plurality of rows and a second plurality of columns, wherein the second plurality of dual-ported memory cells of the second memory array are arranged substantially parallel to the first plurality of dual-ported memory cells of the first memory array; and
a third memory array comprising a third plurality of dual-ported memory cells arranged in a third plurality of rows and a third plurality of columns, wherein the third plurality of dual-ported memory cells of the third memory array are arranged substantially parallel to the first plurality of dual-ported memory cells of the first memory array and the second plurality of dual-ported memory cells of the second memory array; and
a controller operative to:
read a first plurality of bits from each of first dual-ported memory cells of a first row of the first plurality of rows of the first memory array in a first single cycle,
read a second plurality of bits from each of second dual-ported memory cells of a first column of the second plurality of columns of the second memory array in a single second cycle,
write a third plurality of bits into third dual-ported memory cells of a third row of the third plurality of rows of the third memory array in a third single cycle.

10. The apparatus of claim 9, wherein the data storage element comprises a first inverter and a second inverter being cross-coupled to one another.

11. The apparatus of claim 9, wherein the data storage element comprises a dual-ported Dynamic Random-access Memory (DRAM) bit cell.

12. The apparatus of claim 9, wherein the second port bit line and the first word line are substantially parallel.

13. The apparatus of claim 9, wherein the first port bit line and the second word line are substantially parallel.

14. A method comprising:
receiving, at a first row word line of a first memory array, a first activation signal, the first memory array comprising a first plurality of dual-ported memory cells arranged in a first plurality of rows and a second plurality of columns;
activating a plurality of first dual-ported memory cells in a first row of the first memory array corresponding to the first row word line in response to receiving the first activation signal;
reading a first plurality of bits from the plurality of first dual-ported memory cells in the first row of the first plurality of rows of the first memory array in a first single cycle;
receiving, at a first column word line of a second memory array, a second activation signal, the second memory array comprising a second plurality of dual-ported memory cells arranged in a second plurality of rows and a second plurality of columns, wherein the second plurality of dual-ported memory cells of the second memory array are arranged substantially parallel to the first plurality of dual-ported memory cells of the first memory array;
activating a plurality of second dual-ported memory cells in a first column of the second memory array corresponding to the first column word line in response to receiving the second activation signal;
reading a second plurality of bits from the plurality of second dual-ported memory cells of the first column of the second plurality of columns of the second memory array in a single second cycle;
receiving, at a first column word line of a third memory array, a third activation signal, the third memory array comprising a third plurality of dual-ported memory cells arranged in a third plurality of rows and a third plurality of columns, wherein the third plurality of dual-ported memory cells of the third memory array are arranged substantially parallel to the first plurality of dual-ported memory cells of the first memory array and the second plurality of dual-ported memory cells of the second memory array;
activating a plurality of third dual-ported memory cells in a first column of the third memory array corresponding to the first column word line in response to receiving the third activation signal; and
writing a third plurality of bits into the plurality of third dual-ported memory cells of the first column of the third plurality of columns of the third memory array in a single third cycle.

15. The method of claim 14, wherein bit lines corresponding to the first plurality of dual-ported memory cells in the first row of the first memory array are perpendicular to bit lines corresponding to the first plurality of dual-ported memory cells in a first column of the first memory array.

16. The method of claim 14, wherein the row word line of the first memory array is perpendicular to the column word line of the memory array.

17. The method of claim 14, wherein the first activation signal comprises a single read cycle.

18. The method of claim 14, wherein the third activation signal comprises a single write cycle.

19. The method of claim 14, wherein the plurality of memory cells in the first memory array corresponding to the row word line comprise dual-ported Static Random Access Memory (SRAM) bit cells.

20. The method of claim 14, wherein first the plurality of memory cells in the first memory array corresponding to the column word line comprise dual-ported Static Random Access Memory (SRAM) bit cells.

* * * * *

UNITED STATES PATENT AND TRADEMARK OFFICE
CERTIFICATE OF CORRECTION

PATENT NO. : 11,100,980 B2
APPLICATION NO. : 16/584257
DATED : August 24, 2021
INVENTOR(S) : Cormac Michael O'Connell It is certified that error appears in the above-identified patent and that said Letters Patent is hereby corrected as shown below:

On the Title Page

Item (56), Other Publications:
Column 2, Line 1, "Hock "Modem Semiconductor Technologies for Neuromorphic Hardware,"" should read --Hock "Modern Semiconductor Technologies for Neuromorphic Hardware,"--

In the Claims

Column 10, Lines 25-28 (approx.), Claim 9: after "line" delete "wherein the apparatus is configured to read data from the data storage element to the second port bit line when the second word line is enabled"

Column 12, Line 31, Claim 20: "wherein first the plurality" should read --wherein the first plurality--

Signed and Sealed this
Seventh Day of June, 2022

Katherine Kelly Vidal
*Director of the United States Patent and Trademark Office*